United States Patent
Kurachi

(10) Patent No.: US 11,595,029 B2
(45) Date of Patent: Feb. 28, 2023

(54) SWITCH CIRCUIT

(71) Applicants: Kabushiki Kaisha Toshiba, Tokyo (JP); Toshiba Electronic Devices & Storage Corporation, Tokyo (JP)

(72) Inventor: Satoshi Kurachi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/186,166

(22) Filed: Feb. 26, 2021

(65) Prior Publication Data

US 2022/0094264 A1    Mar. 24, 2022

(30) Foreign Application Priority Data

Sep. 24, 2020   (JP) .............................. JP2020-159604

(51) Int. Cl.
| | | |
|---|---|---|
| H03K 3/02 | (2006.01) | |
| H03K 3/013 | (2006.01) | |
| H04B 1/40 | (2015.01) | |
| H04B 15/00 | (2006.01) | |

(52) U.S. Cl.
CPC .............. *H03K 3/02* (2013.01); *H03K 3/013* (2013.01); *H04B 1/40* (2013.01); *H04B 15/00* (2013.01)

(58) Field of Classification Search
CPC ........ H02M 3/07; H02M 3/071; H02M 3/072; H02M 3/073; H02M 3/074; H02M 3/075; H02M 3/076; H02M 3/077; G05F 3/02; G05F 1/10; G05F 1/46
See application file for complete search history.

(56) References Cited

U.S. PATENT DOCUMENTS 9,391,648 B2 * 7/2016 Popplewell .............. H04B 1/44
10,447,153 B2 * 10/2019 Raimar .................... H02M 3/07

FOREIGN PATENT DOCUMENTS

| JP | 2015-012536 A | 1/2015 |
| JP | 5785461 B2 | 9/2015 |
| JP | 2015-208162 A | 11/2015 |

* cited by examiner

*Primary Examiner* — Hai L Nguyen
(74) *Attorney, Agent, or Firm* — Allen & Overy LLP

(57) ABSTRACT

A switch circuit of an embodiment includes a high frequency switch, a first charge pump circuit, a boost signal generation circuit, and a second charge pump circuit. The high frequency switch switches transmission and reception of a high frequency signal. The first charge pump circuit generates a first voltage and a second voltage biased to the high frequency switch. When an edge of an input signal is detected, the boost signal generation circuit generates a first boost signal for temporarily increasing drive capacity of the first charge pump circuit. When the first boost signal is input, the second charge pump circuit operates to temporarily increase the drive capacity of the first charge pump circuit.

8 Claims, 8 Drawing Sheets

SWITCH CIRCUIT

CROSS-REFERENCE TO RELATED APPLICATIONS

This application is based upon and claims the benefit of priority from the prior Japanese Patent Application No. 2020-159604 filed on Sep. 24, 2020; the entire contents of which are incorporated herein by reference.

FIELD

An embodiment of the present invention relates to a switch circuit.

BACKGROUND

A high frequency switch (hereinafter referred to as an RF switch) is used for on-off switching (switching between transmission and reception) in radio signal transmission and reception at a cell-phone base station or the like, impedance tuning switching, and frequency band change switching.

Since the RF switch is used at a cell-phone base station or the like, high power handling and reduction of a switching time of the switch have been required, but it has been difficult to achieve both of high power handling and reduction of the switching time of the switch.

DETAILED DESCRIPTION

A switch circuit of an embodiment includes a high frequency switch, a first charge pump circuit, a boost signal generation circuit, and a second charge pump circuit. The high frequency switch switches transmission and reception of a high frequency signal. The first charge pump circuit generates a first voltage and a second voltage biased to the high frequency switch. When an edge of an input signal is detected, the boost signal generation circuit generates a first boost signal for temporarily increasing drive capacity of the first charge pump circuit. When the first boost signal is input, the second charge pump circuit operates to temporarily increase the drive capacity of the first charge pump circuit.

The embodiment will be described below with reference to the accompanying drawings.

Figure 1:
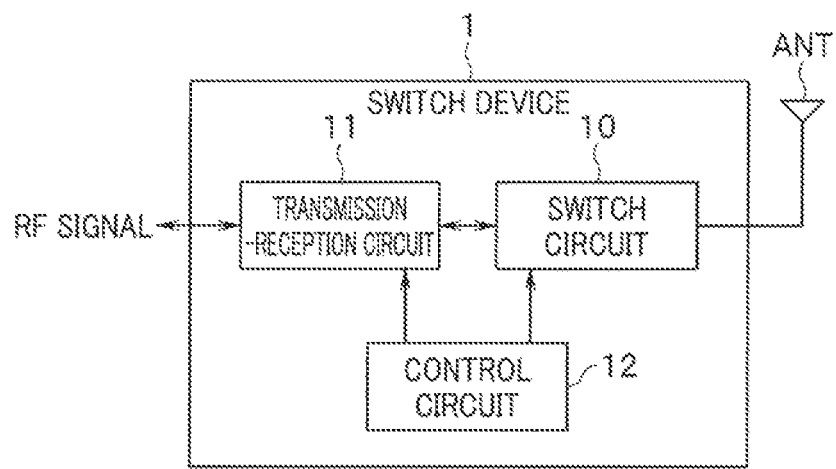
FIG. 1 is a configuration diagram illustrating an exemplary configuration of a switch device including a switch circuit according to an embodiment.

FIG. 1 is a configuration diagram illustrating an exemplary configuration of a switch device including the switch circuit according to the embodiment.

The switch device 1 includes a switch circuit 10, a transmission-reception circuit 11, and a control circuit 12. The switch device 1 is connected with an antenna ANT. The control circuit 12 is connected with the switch circuit 10 and the transmission-reception circuit 11. The control circuit 12 controls transmission and reception of a high frequency signal (hereinafter referred to as RF signal) by controlling the switch circuit 10 and the transmission-reception circuit 11. Accordingly, the switch device 1 can perform, for example, transmission and reception of the RF signal.

The control circuit 12 outputs a control signal CTRL, which will be described later, to the switch circuit 10. Switching of the switch circuit 10 is performed in accordance with the control signal CTRL from the control circuit 12.

Figure 2:
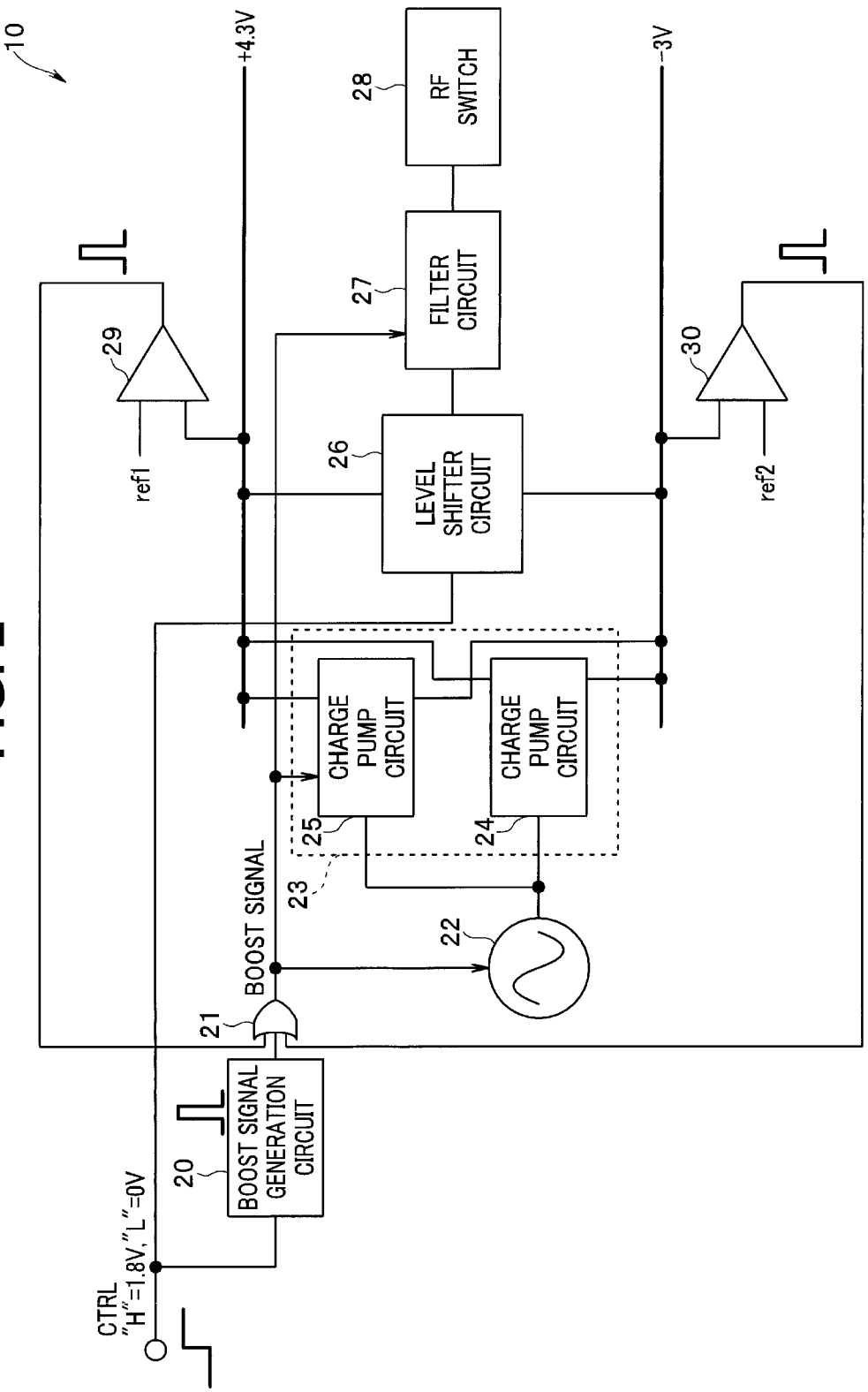
FIG. 2 is a configuration diagram illustrating an exemplary configuration of the switch circuit.

FIG. 2 is a configuration diagram illustrating an exemplary configuration of the switch circuit.

The switch circuit 10 includes a boost signal generation circuit 20, an OR circuit 21, an oscillator (hereinafter referred to as an OSC) 22, a charge pump unit 23 including charge pump circuits 24 and 25, a level shifter circuit 26, a filter circuit 27, an RF switch 28, and comparators 29 and 30.

The control signal CTRL, from the control circuit 12 is input to the boost signal generation circuit 20. The control signal CTRL is a signal having an L level at 0 V and an H level at 1.8 V. When one of a rising edge at which the control signal CTRL transitions from the L level to the H level and a falling edge at which the control signal CTRL transitions from the H level to the L level is detected, the boost signal generation circuit 20 outputs a boost signal (first boost signal) at the H level to the OR circuit 21.

In addition to the boost signal from the boost signal generation circuit 20, boost signals (second and third boost signals) at the H level from the comparators 29 and 30 are input to the OR circuit 21 as described later. When any one of the boost signals from the boost signal generation circuit 20 and the comparators 29 and 30 is at the H level, the OR circuit 21 outputs an H-level boost signal to the OSC 22, the charge pump circuit 25, and the filter circuit 27.

The OSC 22 can generate a clock signal (pulse signal) CLK of a predetermined frequency. The OSC 22 outputs the generated clock signal CLK of the predetermined frequency to the charge pump circuits 24 and 25. When a boost signal to be described later is input, the OSC 22 generates the clock signal CLK having a frequency temporarily made higher than the predetermined frequency and outputs the clock signal CLK to the charge pump circuits 24 and 25.

For example, a power source VDD of 3 V or a ground GND of 0 V is input to the charge pump circuit 24 included in the first charge pump circuit. The charge pump circuit 24 steps up or down the power source VDD or the ground GND in accordance with the clock signal CLK and outputs +4.3 V (first voltage) or −3 V (second voltage). The output of +4.3 V is input to the level shifter circuit 26 and the comparator 29. The output of −3 V is input to the level shifter circuit 26 and the comparator 30.

The charge pump circuit 25 included in the second charge pump circuit operates only when a boost signal is input. Specifically, when drive capacity of the charge pump circuit 24 decreases and +4.3 V and −3 V cannot be output, the charge pump circuit 25 increases drive capacity by increasing current capability.

The control signal CTRL having an L level at 0 V and an H level at 1.8 V is input to the level shifter circuit 26 from the control circuit 12. When 1.8 V is input as the control signal CTRL, the level shifter circuit 26 performs level shift to +4.3 V and outputs the control signal CTRL to the filter circuit 27. When 0 V is input as the control signal CTRL, the level shifter circuit 26 performs level shift to −3 V and outputs the control signal CTRL to the filter circuit 27.

The filter circuit 27 isolates (separates) noise and the like from an input signal and outputs the signal to the RF switch 28. Although described later in detail, when an H-level boost signal is input, the filter circuit 27 outputs the input signal to the RF switch 28 without isolation.

The RF switch 28 performs switching of the switch based on an input signal. The RF switch 28 has one end connected with the antenna ANT and the other end connected with the transmission-reception circuit 11. With such a configuration, the switch circuit 10 can output, to the transmission-reception circuit 11, an RF signal received through the antenna ANT, and can transmit, through the antenna ANT, an RF signal input from the transmission-reception circuit 11.

The comparator 29 compares the output voltage of +4.3 V from the charge pump circuit 24 with reference voltage ref1, and outputs a boost signal (H-level signal) to the OR circuit 21 when the output voltage is lower than the reference voltage ref1.

The comparator 30 compares the output voltage of −3 V from the charge pump circuit 24 with reference voltage ref2 and outputs a boost signal (H-level signal) to the OR, circuit 21 when the output voltage is higher than the reference voltage ref2.

The switch circuit 10 may be formed on a silicon-on-insulator (SOI). When the switch circuit 10 is formed on the SOI, high power handling can be achieved. In addition, when the switch circuit 10 is formed on the SOI, parasitic capacitance decreases as compared to a bulk CMOS, or fast switching of the RF switch can be achieved as compared to a silicon substrate.

Figure 3:
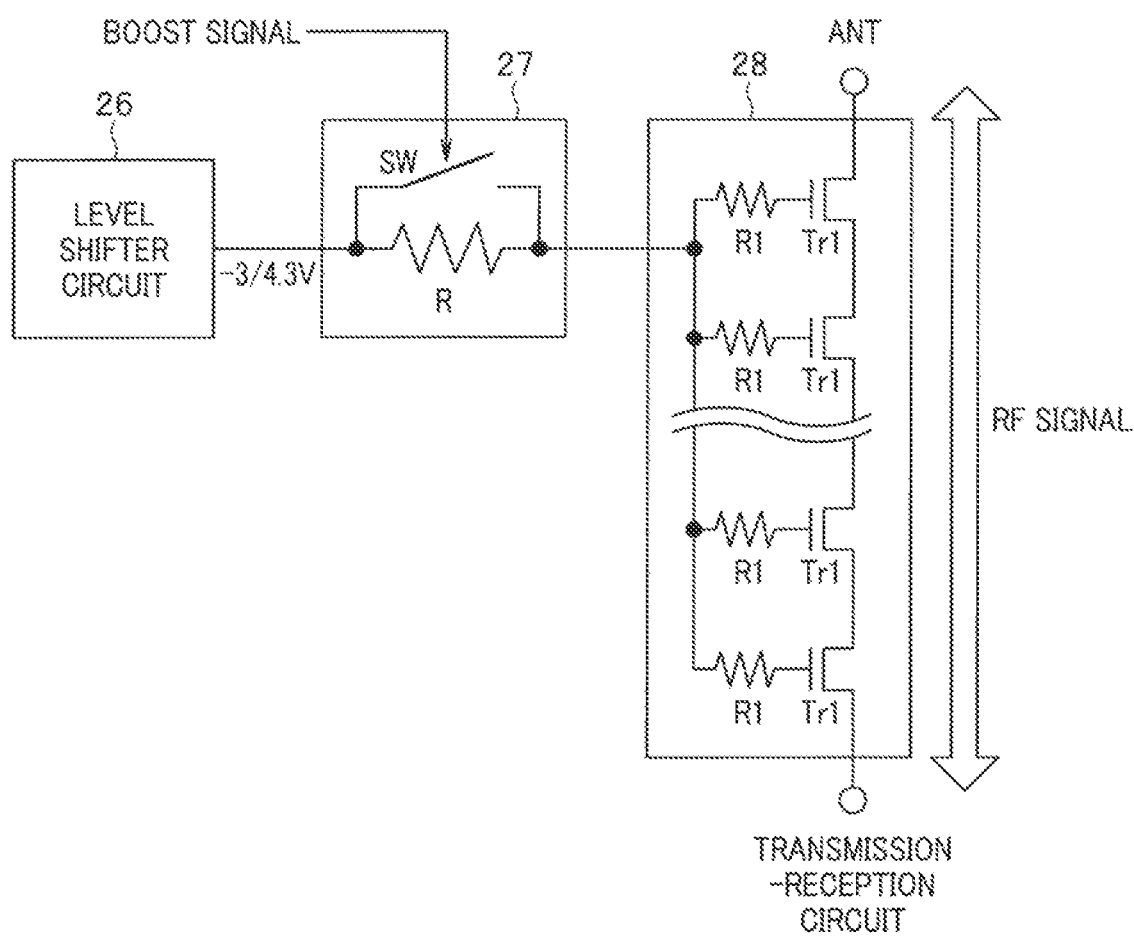
FIG. 3 is a configuration diagram illustrating exemplary configurations of a filter circuit and an RF switch of the switch circuit.

FIG. 3 is a configuration diagram illustrating exemplary configurations of the filter circuit and the RF switch of the switch circuit.

The filter circuit 27 includes an isolation resistor R, and a switch SW connected in parallel with the resistor R. The isolation resistor R prevents inputting of noise and the like from the filter circuit 27 side to the RF switch 28.

The switch SW switches "ON" and "OFF" in accordance with a boost signal. When an H-level boost signal is input, the switch SW is turned "ON" and directly inputs, to the RF switch 28, an output from the level shifter circuit 26.

Specifically, when an H-level boost signal is input, the isolation resistor R is temporarily short-circuited. Accordingly, an RC time constant, which is determined by the product of the resistance value of the filter circuit 27 and the capacitance of the RF switch 28, is decreased, and the switching time of the RF switch 28 is reduced.

The RF switch 28 includes a plurality of transistors Tr1, the sources and drains of which are connected in series. The gate of each transistor Tr1 is connected with one end of a power handling resistor R1 for preventing leakage of an RF signal to the filter circuit 27 side. The other end of each resistor R1 is connected with the isolation resistor R.

An RF signal is input from the antenna ANT or output to the antenna ANT. As described above, the RF switch 28 has one end connected with the antenna ANT and the other end connected with the transmission-reception circuit 11. When the switch circuit 10 is used for switching in impedance tuning, a tuning element such as a capacitor or an inductor is connected with the other end of the RF switch 28.

Figure 4:
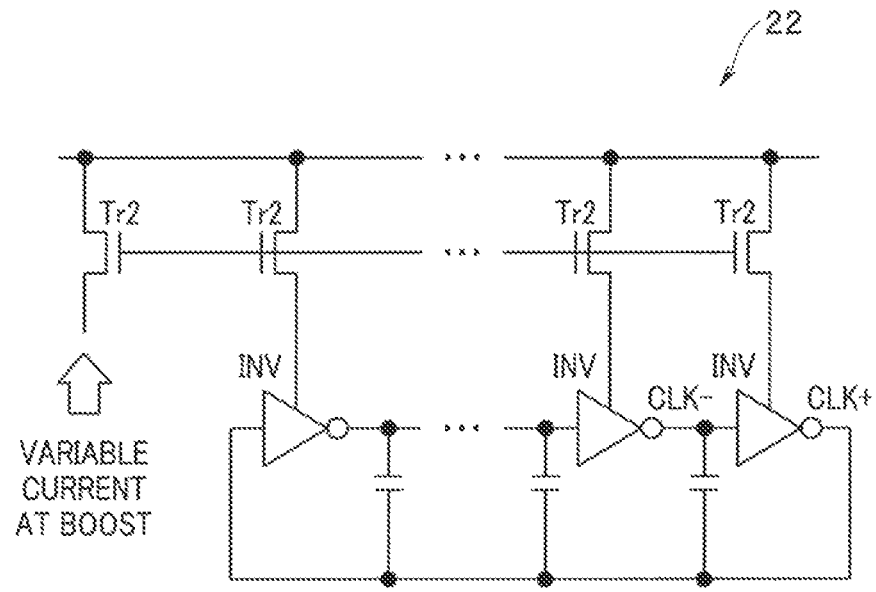
FIG. 4 is a circuit diagram illustrating an exemplary circuit configuration of an OSC.

FIG. 4 is a circuit diagram illustrating an exemplary circuit configuration of the OSC.

The OSC 22 is a device composed of inverters INV in a ring shape which have a variable delay amount. When a boost signal is input, the OSC 22 increases current supplied to the inverters INV through a plurality of transistors Tr2, thereby increasing the frequency of the clock signal CLK.

Note that the OSC 22 is not limited to a ring oscillator in which the plurality of inverters INV are connected in a ring shape, but may be an oscillator of any other kind that is capable of generating the clock signal CLK of a desired frequency.

Figure 5:
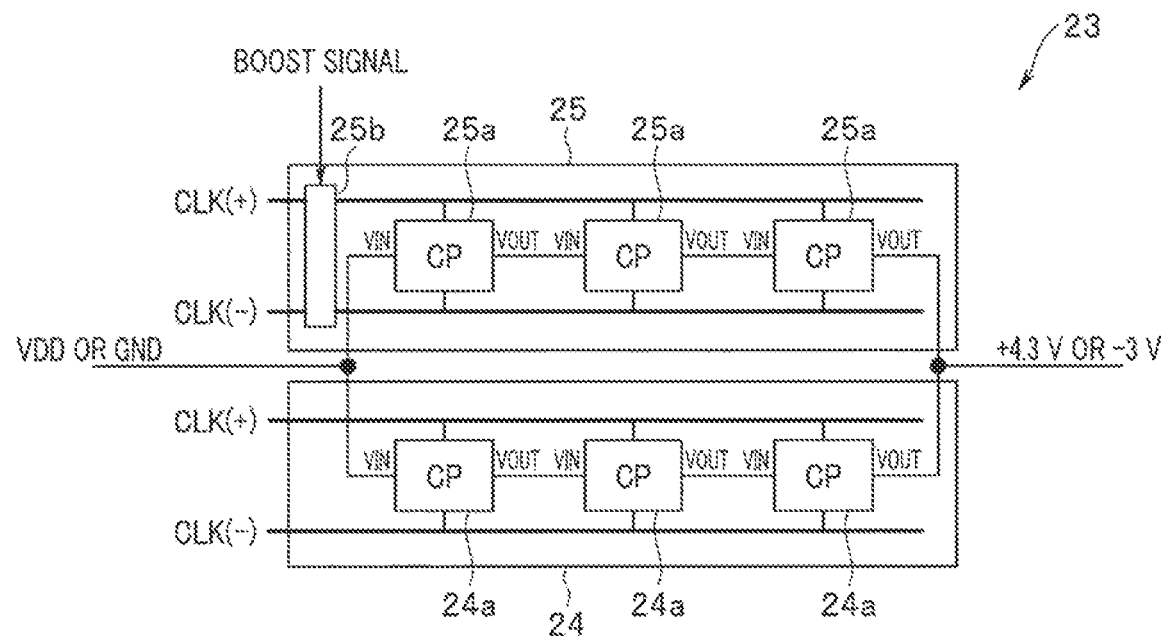
FIG. 5 is a configuration diagram illustrating an exemplary configuration of a charge pump unit.
Figure 6:
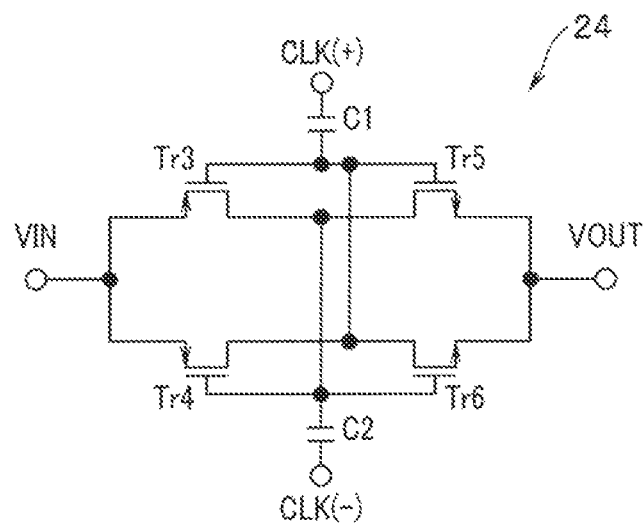
FIG. 6 is a circuit diagram illustrating an exemplary circuit configuration of a charge pump circuit.

FIG. 5 is a configuration diagram illustrating an exemplary configuration of the charge pump unit. FIG. 6 is a circuit diagram illustrating an exemplary circuit configuration of each charge pump circuit.

The charge pump circuit 24 steps up or down the power source VDD or the ground GND and outputs +4.3 V or −3 V. The charge pump circuit 24 may include a plurality of charge pump circuits 24a connected in series when step-up or step-down to +4.3 V or −3 V cannot be performed by one charge pump circuit 24. The charge pump circuit 25 may include a plurality of charge pump circuits 25a connected in series.

A clock signal CLK(+) from the OSC 22 and an inverted clock signal CLK(−) obtained through inversion by, for example, an inverter circuit are input to the charge pump circuits 24 and 25. In the charge pump circuit 25, a switching circuit 25b is provided on signal lines of the clock signal CLK(+) and the inverted clock signal CLK(−).

When an H-level boost signal is input, the switching circuit 25b performs switching so that the clock signal CLK and the inverted clock signal CLK(−) are input to the charge pump circuit 25 (or 25a). Accordingly, only when the boost signal is input, the charge pump circuit 25 (or 25a) operates to increase the drive capacity of the charge pump circuit 24.

As illustrated in FIG. 6, the charge pump circuit 24 includes p-type transistors Tr3 and Tr4, n-type transistors Tr5 and Tr6, and capacitors C1 and C2. The charge pump circuit 24 outputs an output signal stepped up or down from an input signal by controlling "ON" and "OFF" of the transistors Tr3 to Tr6 through the clock signal CLK(+) and the inverted clock signal CLK(−) to store electric charge at the capacitors C1 and C2 or discharge electric charge from the capacitors C1 and C2.

The charge pump circuit 25 has a configuration same as the configuration of the charge pump circuit 24 illustrated in FIG. 6. Note that the charge pump circuits 24 and 25 are not limited to the configuration including the p-type transistors Tr3 and Tr4, the n-type transistors Tr5 and Tr6, and the capacitors C1 and C2 in FIG. 6 but may have other configurations.

Figure 7:
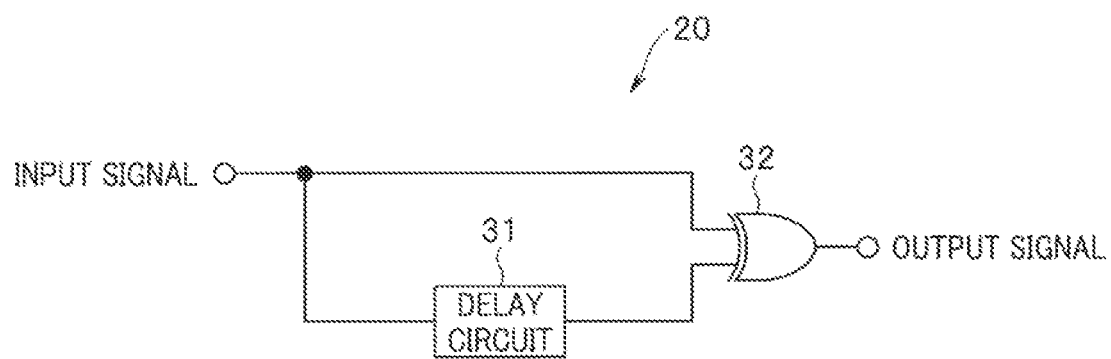
FIG. 7 is a circuit diagram illustrating an exemplary circuit configuration of a boost signal generation circuit.
Figure 8:
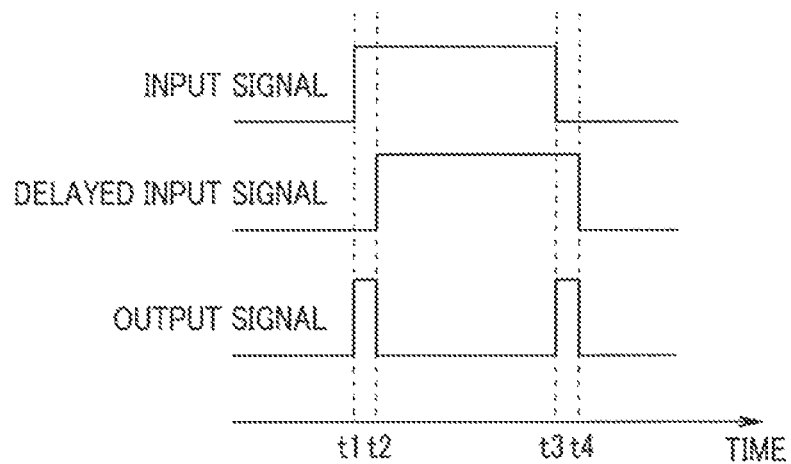
FIG. 8 is a waveform diagram illustrating exemplary waveforms of input and output signals of the boost signal generation circuit.

FIG. 7 is a circuit diagram illustrating an exemplary circuit configuration of the boost signal generation circuit. FIG. 8 is a waveform diagram illustrating exemplary waveforms of input and output signals of the boost signal generation circuit.

As illustrated in FIG. 7, the boost signal generation circuit 20 includes a delay circuit 31 and an XOR circuit 32.

An input signal (control signal CTRL) input to the boost signal generation circuit 20 is input to the delay circuit 31 and one terminal of the XOR circuit 32. The delay circuit 31 delays the input signal by a predetermined time before outputting the input signal to the XOR circuit 32. The input signal delayed by the predetermined time by the delay circuit 31 is input to the other terminal of the XOR circuit 32.

Accordingly, the input signal and the delayed input signal as illustrated in FIG. 8 are input to the XOR circuit 32. The input signal switches from the L level to the H level at time t1 and switches from the H level to the L level at time 3. The delayed input signal, which is delayed by the delay circuit 31, switches from the L, level to the H level at time t2 and switches from the H level to the L level at time t4.

When the levels of the input signals are different from each other, the XOR circuit 32 outputs an H-level signal. Thus, the XOR circuit 32 outputs an H-level output signal (boost signal) to the OR circuit 21 from time t1 to time t2 and from time t3 to time t4.

In this manner, when the control signal CTRL switches from the L level to the H level or the from the H level to the L level, the boost signal generation circuit 20 immediately outputs the output signal (boost signal) to the OR circuit 21. In other words, when the rising or falling edge of the control signal CTRL is detected, the boost signal generation circuit 20 immediately outputs the H-level output signal (boost signal) to the OR circuit 21. The output signal has a pulse width that can be optionally determined based on a duration (delay amount) by which the delay circuit 31 delays the input signal. Note that the boost signal generation circuit 20 is not limited to the configuration in FIG. 7 but may have any other configuration with which the edge of the control signal CTRL can be detected.

Figure 9:
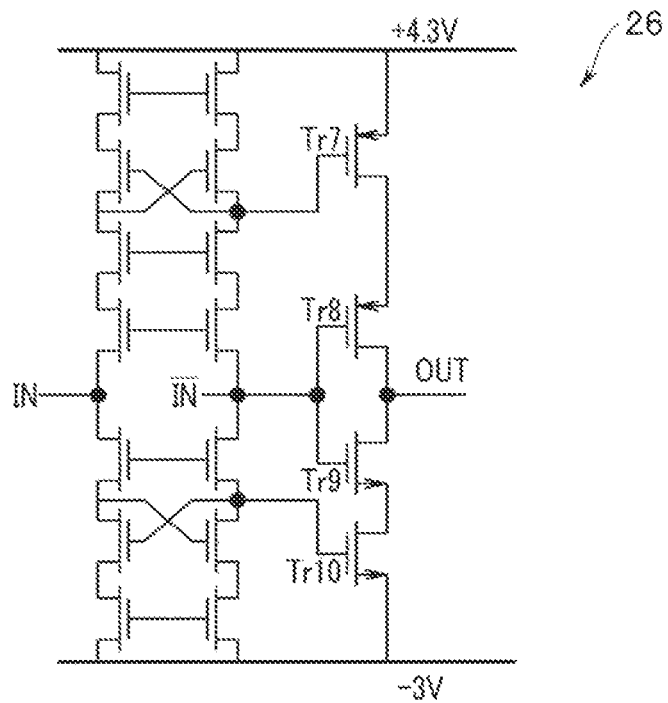
FIG. 9 is a circuit diagram illustrating an exemplary circuit configuration of a level shifter circuit.

FIG. 9 is a circuit diagram illustrating an exemplary circuit configuration of the level shifter circuit.

The level shifter circuit 26 includes a plurality of transistors. The level shifter circuit 26 receives the control signal CTRL as an input, and the inverted control signal CTRL as an inverted input.

When the control signal CTRL at the H level (1.8 V) is input, p-type transistors Tr7 and Tr8 are turned on, and the level shifter circuit 26 outputs an output signal subjected to level shift to +4.3 V.

When the control signal CTRL at the L level (0 V) is input, n-type transistors Tr9 and Tr10 are turned on, and the level shifter circuit 26 outputs an output signal subjected to level shift to −3 V.

Note that the level shifter circuit 26 is not limited to the configuration in FIG. 9 but may have any other configuration that performs level shift of the H-level and L-level control signals CTRL to +4.3 V and −3 V.

Figure 10:
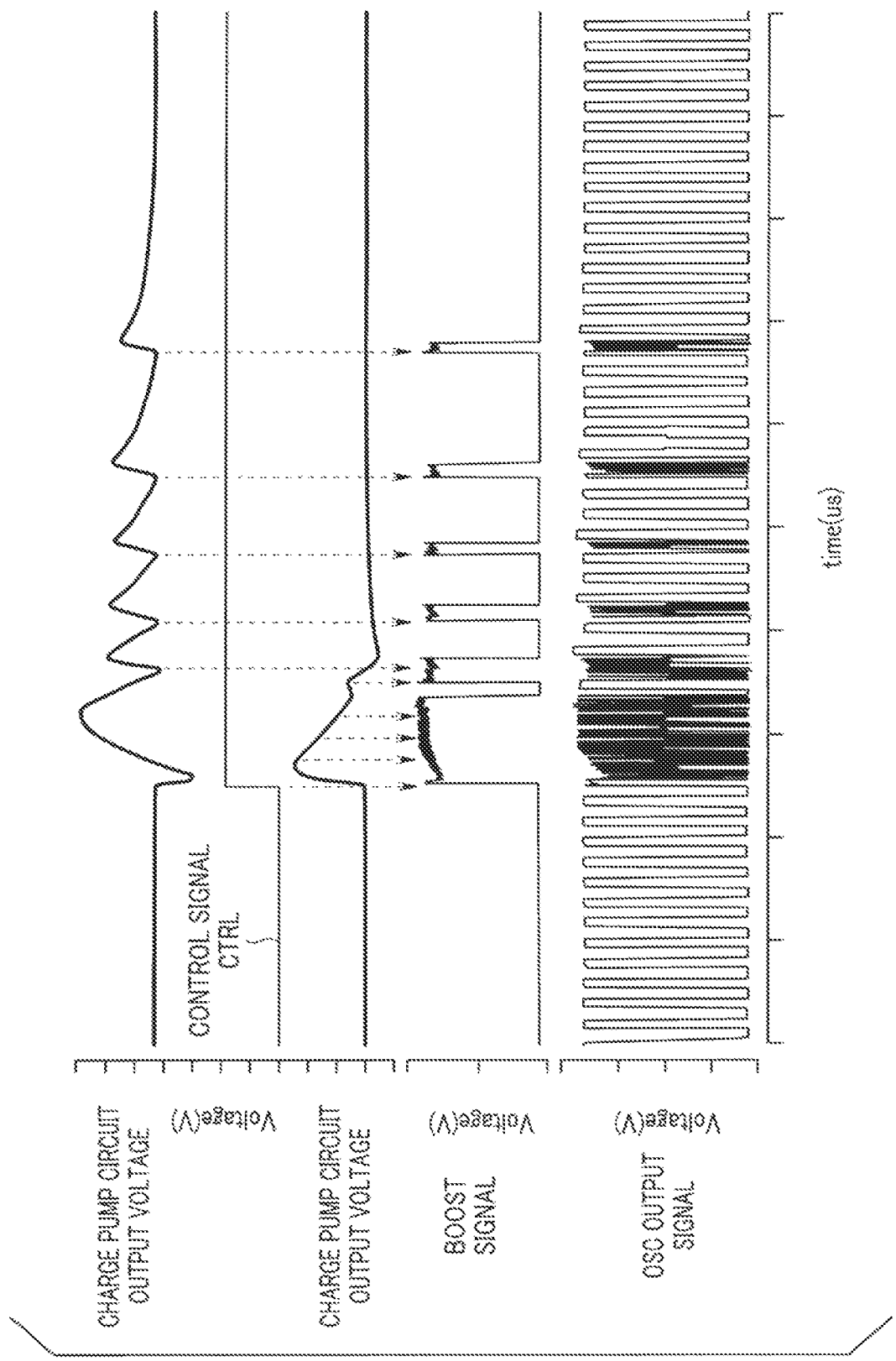
FIG. 10 is a waveform diagram illustrating simulation results of output voltage of the charge pump unit, a boost signal, and an OSC output signal.

FIG. 10 is a waveform diagram illustrating simulation results of output voltage of the charge pump unit, a boost signal, and an OSC output signal.

When the control signal CTRL changes from the H level to the L level (from "off" to "on") or from the L level to the H level (from "on" to "off"), flow-through current flows to the level shifter circuit 26 and the output voltage of the charge pump circuit 24 of the charge pump unit 23 steps down.

When signal level change (rising or falling edge) of the control signal CTRL is detected, the boost signal generation circuit 20 outputs a boost signal to the OR circuit 21 and the boost signal immediately becomes the H level.

In addition, when step-down (or step-up) of the output voltage of the charge pump unit 23 is detected through comparison of the output voltage of the charge pump unit 23 with the reference voltages ref1 and ref2, the comparators 29 and 30 output the boost signal to the OR circuit 21. Accordingly, the boost signal becomes the H level even not right after signal level change of the control signal CTRL.

The boost signal is input to the OSC 22 and the charge pump circuit 25 of the charge pump unit 23. When the boost signal is input to the OSC 22, the frequency of the output signal (the clock signal CLK) of the OSC 22 increases and the output voltage of the charge pump unit 23 steps up. In addition, when the boost signal is input to the charge pump circuit 25, the charge pump circuit 25 operates and the output voltage of the charge pump unit 23 steps up.

Note that the boost signal, which is input to the OSC 22 and the charge pump unit 23, may be input to any one of the OSC 22 and the charge pump unit 23. With the configuration in which the boost signal is input to any one of the OSC 22 and the charge pump unit 23, as well, the output voltage of the charge pump unit 23 can be stepped up.

When the rising or falling edge of the control signal CTRL is detected, the boost signal generation circuit 20 outputs the boost signal to the OR circuit 21. Accordingly, the boost signal is input from the OR circuit 21 to the OSC 22 and the charge pump unit 23. As a result, drive capacity of the charge pump unit 23, which generates gate voltage of the RF switch 28, can be increased, and thus the switching time of the RF switch 28 can be reduced.

Simulation results when the switch circuit 10 includes no boost signal generation circuit 20 and when the switch circuit 10 includes the boost signal generation circuit 20 will be described below with reference to FIGS. 11 and 12.

Figure 11:
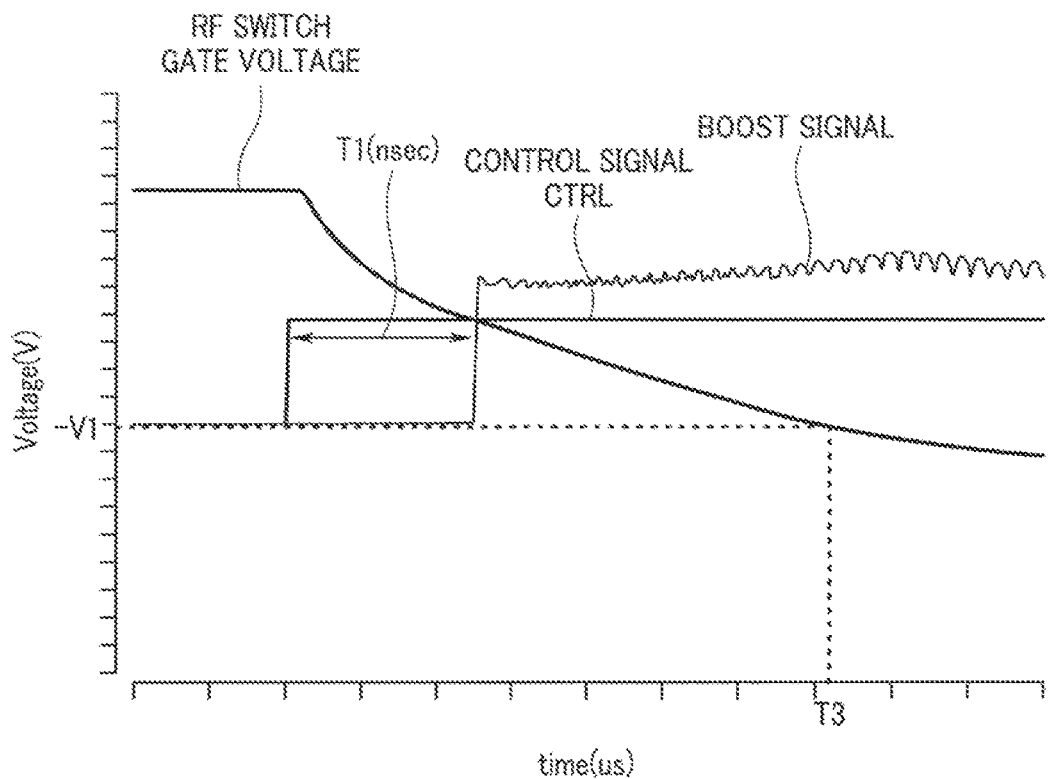
FIG. 11 is a waveform diagram illustrating a simulation result without a boost signal generation circuit.
Figure 12:
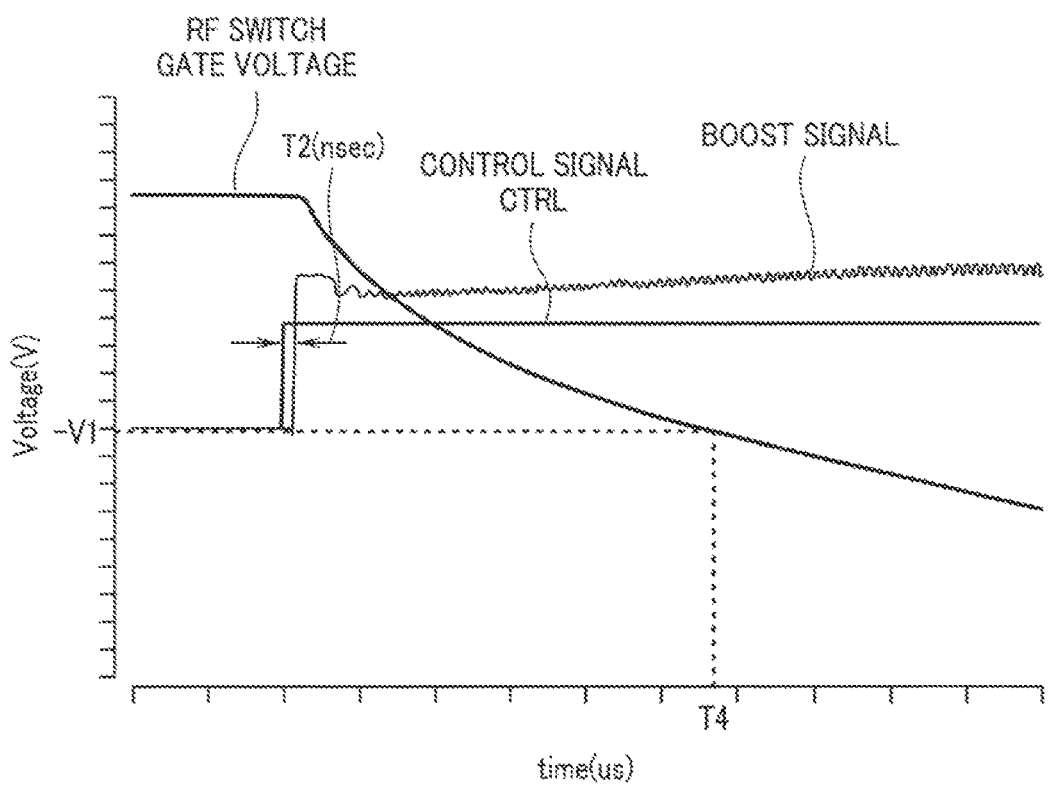
FIG. 12 is a waveform diagram illustrating a simulation result with the boost signal generation circuit.

FIG. 11 is a waveform diagram illustrating a simulation result without the boost signal generation circuit. FIG. 12 is a waveform diagram illustrating a simulation result with the boost signal generation circuit.

When the switch circuit 10 includes no boost signal generation circuit 20, the boost signal is input from the comparator 29 or 30 after step-down (or step-up) of the output voltage of the charge pump circuit 24 occurs. Thus, when the switch circuit 10 includes no boost signal generation circuit 20, the boost signal is generated T1 (nsec) after switching of the signal level of the control signal CTRL.

However, when the switch circuit 10 includes the boost signal generation circuit 20, the boost signal is generated immediately after detection of an edge of the control signal CTRL. Thus, when the switch circuit 10 includes the boost signal generation circuit 20, the boost signal is generated T2 (nsec) after switching of the signal level of the control signal CTRL.

When gate voltage at which switch switching is completed is assumed to be −V1 (V), the switch switching is completed in T3 (usec) when the switch circuit 10 includes no boost signal generation circuit 20. However, when the switch circuit 10 includes the boost signal generation circuit 20, the switch switching is completed in T4 (usec).

When the switch circuit 10 includes the boost signal generation circuit 20, the switching time of the switch is reduced by a predetermined time as compared to when the switch circuit 10 includes no boost signal generation circuit 20, and the RF switch 28 can be switched fast.

Conventionally, since a RF switch is used at a cell-phone base station or the like, high power handling and reduction of the switching time of the switch have been requested. The high power handling can be achieved by connecting the RF switch in series, but the switching time is determined by the RC time constant as the product of the resistance value of a filter circuit and the capacitance of the RF switch, and thus reduction of the switching time has a limitation.

In a conventional configuration, to reduce switching time, when step-down or step-up of the output voltage of a charge pump circuit, which determines the gate voltage of the RF switch, is detected, a boost signal for stepping up or down the output voltage of the charge pump circuit is output to the charge pump circuit. The charge pump circuit performs boost operation in accordance with the boost signal to temporarily increase current capability, thereby reducing the switching time.

However, since the boost signal is output after step-down or step-up of the output voltage of the charge pump circuit is detected, a time until the detection is needed, and switching time of the RF switch cannot be reduced.

However, in the switch circuit 10 of the present embodiment, the boost signal generation circuit 20 configured to detect an edge of the control signal CTRL is provided and outputs a boost signal to the OSC 22 and the charge pump circuit 25 immediately after detection of an edge of the control signal CTRL. Accordingly, the current capability of the charge pump circuits 24 and 25 is increased, thereby reducing the switching time of the RF switch 28.

Thus, with the switch circuit 10 of the present embodiment, it is possible to achieve high power handling and reducing the switching time of the RF switch 28.

In addition, in the present embodiment, the switch SW is provided in parallel to the isolation resistor R of the filter circuit 27, and the isolation resistor R is temporarily short-circuited when the boost signal is input. Accordingly, the RC time constant, which is determined by the product of the resistance value of the filter circuit 27 and the capacitance of the RF switch 28, is decreased, thereby reducing the switching time of the RF switch 28.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A switch circuit comprising:
   a high frequency switch configured to switch transmission and reception of a high frequency signal;
   a first charge pump circuit configured to generate a first voltage and a second voltage;
   a level shifter circuit configured to level-shift a control signal inputted thereto to the first voltage or the second voltage and output the control signal to the high frequency switch through a filter circuit;
   a boost signal generation circuit configured to generate a first boost signal for temporarily increasing drive capacity of the first charge pump circuit when an edge of an input signal is detected; and
   a second charge pump circuit configured to operate to temporarily increase the drive capacity of the first charge pump circuit when the first boost signal is input.

2. The switch circuit according to claim 1, further comprising:
   a resistor for separating noise from a signal input to the high frequency switch; and
   a switch connected in parallel with the resistor and configured to temporarily short-circuit the resistor in accordance with the first boost signal.

3. The switch circuit according to claim 1, wherein the boost signal generation circuit includes
   a delay circuit configured to delay the input signal by a predetermined time, and
   an exclusive OR circuit configured to calculate an exclusive OR of the input signal and a delayed input signal delayed by the delay circuit.

4. The switch circuit according to claim 1, further comprising a first comparator configured to compare the first voltage with a first reference voltage and generate a second boost signal when the first voltage is lower than the first reference voltage.

5. The switch circuit according to claim 4, further comprising a second comparator configured to compare the second voltage with a second reference voltage and generate a third boost signal when the second voltage is higher than the second reference voltage.

6. The switch circuit according to claim 5, further comprising an OR circuit configured to calculate an OR of the first boost signal, the second boost signal, and the third boost signal.

7. The switch circuit according to claim 1, further comprising an oscillator configured to generate a clock signal at a predetermined frequency and generate a clock signal at a frequency higher than the predetermined frequency when the first boost signal is input.

8. The switch circuit according to claim 1, wherein the switch circuit is formed on a silicon-on-insulator (SOI).

* * * * *